United States Patent [19]

Oda

[11] Patent Number: 4,601,098
[45] Date of Patent: Jul. 22, 1986

[54] METHOD OF MANUFACTURING PLURAL ACTIVE REGIONS FOLLOWED BY A CHAIN STEP FORMATION

[75] Inventor: Eiji Oda, Tokyo, Japan

[73] Assignee: NEC Corporation, Tokyo, Japan

[21] Appl. No.: 671,745

[22] Filed: Nov. 15, 1984

[30] Foreign Application Priority Data

Nov. 15, 1983 [JP] Japan ................. 58-214545

[51] Int. Cl.⁴ ............... H01L 21/20; H01L 21/26
[52] U.S. Cl. ........................... 29/578; 29/571; 29/576 B; 29/579; 148/1.5; 156/643
[58] Field of Search ............. 29/578, 579, 576 B, 29/571; 148/1.5; 156/643

[56] References Cited

U.S. PATENT DOCUMENTS

| | | | |
|---|---|---|---|
| 4,170,500 | 10/1979 | Crossley | 148/187 |
| 4,343,079 | 8/1982 | Jochems | 29/571 |
| 4,376,664 | 3/1983 | Hataishi | 148/175 |
| 4,414,058 | 11/1983 | Mueller | 156/643 |
| 4,435,895 | 3/1984 | Parrillo | 29/571 |
| 4,473,940 | 10/1984 | Kiriseko | 29/576 W |
| 4,481,705 | 11/1984 | Haskell | 29/571 |

Primary Examiner—Upendra Roy
Attorney, Agent, or Firm—Laff, Whitesel, Conte & Saret

[57] ABSTRACT

A semiconductor device has an active region formed on a semiconductor substrate. The opposite sides of the active region are defined by channel stoppers. The semiconductor device is made by a manufacturing process which prevents the active region from narrowing responsive a spreading of the channel stopper into the active region. This method comprises the steps of forming a first oxide layer by oxidizing a surface of the semiconductor substrate; forming a nitride layer over the first oxide layer; forming a second oxide layer having a predetermined thickness over a predetermined portion of the first layer where the active region is to be formed, the second layer being formed by removing the nitride layer over the predetermined portion and then oxidizing; removing the nitride layer; implanting an impurity for forming the channel stoppers by using the second oxide layer as a mask; removing the second oxide layer; forming a gate oxide layer by oxidizing over the active region; and forming an electrode over the gate oxide layer.

10 Claims, 9 Drawing Figures

METHOD OF MANUFACTURING PLURAL ACTIVE REGIONS FOLLOWED BY A CHAIN STEP FORMATION

This invention relates to a method for manufacturing a semiconductor device, and more particularly to a manufacturing method for compressing a narrow channel effect in a semiconductor device.

BACKGROUND OF THE INVENTION

Recently, with the progress of a semiconductor integrated circuit manufacturing technique, a multi-element and high element-density semiconductor device have been developed. The progress of micro processing techniques in a semiconductor device manufacturing makes it possible to manufacture a very large scale integrated circuit (VLSI) employing a 1.5 m or 1 m rule. However, the manufacturing of such VLSI gives rise to various problems due to a miniaturization of the device. One of these problems is a "narrow channel effect" by which a threshold voltage $V_T$ is increased as a channel width of a transistor is narrowed. This effect causes disadvantages because a driving voltage, which is higher than a necessary voltage, must be applied to the device; or, not enough electric current can flow in the device to drive it. This means that necessary signal charges cannot be handled in a charge coupled device (CCD).

SUMMARY OF THE INVENTION

It is, therefore, an object of this invention to provide a method for manufacturing semiconductor devices by which a narrow channel effect can be compressed.

According to this invention, a method for manufacturing a semiconductor device provides an active region formed on a semiconductor substrate and defined by a channel stopper. The method comprises: a step of forming a first oxide layer by oxidizing a surface of the semiconductor substrate; a step of forming a nitride layer on the first oxide layer; a step of forming a second oxide layer having a predetermined thickness on a predetermined portion by removing the nitride layer at which the active region is to be formed on the predetermined portion and then oxidizing; a step of removing the nitride layer; a step of implanting an impurity for forming a channel stopper by using the second oxide layer as a mask; a step of removing the second oxide layer; a step of forming an oxide gate layer of the active region by oxidizing; and a step of forming an electrode.

BRIEF DESCRIPTION OF THE DRAWINGS

The features and advantages of this invention will be understood from the following detailed description of a preferred embodiment of this invention, taken in conjunction with the accompanying drawings in which.

DESCRIPTION OF THE PREFERRED EMBODIMENT

Figure 1A:
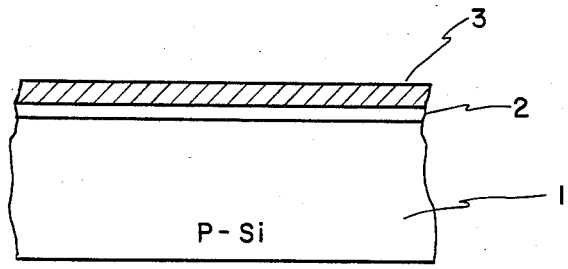
FIGS. 1(a) to 1(d) are cross sectional views of a semiconductor device, showing the principal steps of a method of manufacturing the semiconductor device according to a conventionl method.
Figure 1B:
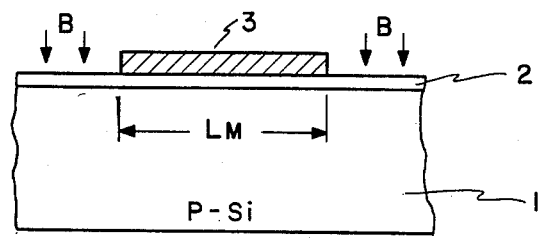
Figure 1C:
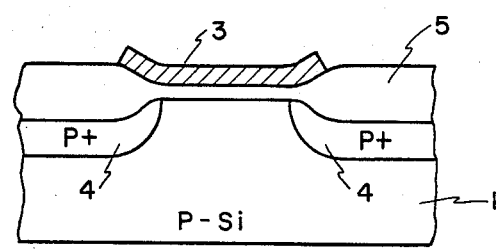
Figure 1D:
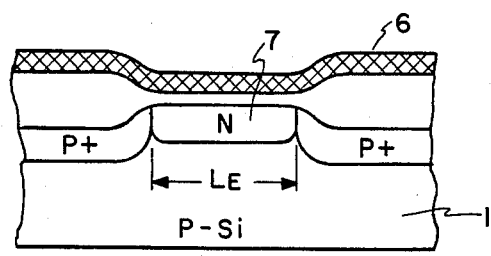

First, a conventional method for manufacturing a MOS semiconductor device will be described with reference to FIGS. 1(a) to 1(d).

In manufacturing a MOS semiconductor device, a P-type substrate 1 is thermally oxidized to form a first oxide layer 2. Then, a nitride layer 3 is formed on the oxide layer 2 by means of a vapor deposition (FIG. 1(a)). A portion of the nitride layer 3, at which a field is to be formed thereafter, is removed by means of an etching technique. An impurity having the same conductivity type as the substrate, for example, a boron, is diffused into the etched portion by means of an ion implantation or a thermal diffusion (FIG. 1(b)). The field portion is heavily oxidized to form a field oxide layer 5 (FIG. 1(c)). Then, the nitride layer 3 is removed. After an active region is oxidized to form a gate oxide layer and an ion implantation for a channel dope is achieved, an electrode 6 is formed (FIG. 1(d)). In FIG. 1, reference numerals 4 and 7 identify a P+-type channel stopper and a semiconductor region for a channel dope, respectively.

The formation of the field oxide layer 5 occurs in a series of manufacturing steps. The oxidization progresses from a boundary portion between an edge portion of the nitride layer and the field, and continues toward the active region to form a non-active region called a "bird's beak." Not only such an oxide layer, but also the boron impurity diffused as the channel stopper, are spread laterally with respect to the active region.

The "bird's beak" and the laterally spread channel stopper reduce the area of the active region. More specifically, the portion, at which the active layer is thereafter to be formed, is defined to have a width $L_M$ in FIG. 1(a). The width of the final active region is reduced to $L_E$ due to the bird's beak and to the lateral spread of the channel stopper. This causes a narrow channel effect which inevitably increases the threshold voltage in the case where the channel width $L_M$ is extremely narrowed.

FIG. 2 shows a series of steps in a method of manufacturing a MOS semiconductor device according to an embodiment of this invention.

In manufacturing a MOS semiconductor device according to this embodiment, a semiconductor substrate (a P-type substrate in this embodiment) 1 is thermally oxidized to form a first oxide layer 2. Then, a nitride layer 3 is formed on the oxide layer 2 (FIG. 2(a)). Next, a portion of the nitride layer 3 is removed at an active region which is to be formed thereafter (FIG. 2(b)). An impurity for a channel dope, for example, a phosphorus or a boron, is diffused to form a thermal oxide layer 15 having a predetermined thickness. The thickness of the thermal oxide layer 15 is set so that an impurity for the channel stopper does not progress into the active region during the implanting of the impurity for the channel stopper, in the following next step (FIG. 2(c)). Then, the nitride layer 3 is removed and the impurity for the channel stopper is implanted to form the channel stopper 12 (FIG. 2(d)). Next, the oxide layer of the upper surface is removed. Then, a thermal oxidization is again achieved to form a gate oxide layer 13. Thereafter, an electrode 14 is formed (FIG. 2(e)). In FIG. 2, reference numeral 11 identifies a channel-doped semiconductor region (an N-type silicon having a reverse conductivity as compared to the conductivity of the semiconductor substrate 1).

Figure 2A:
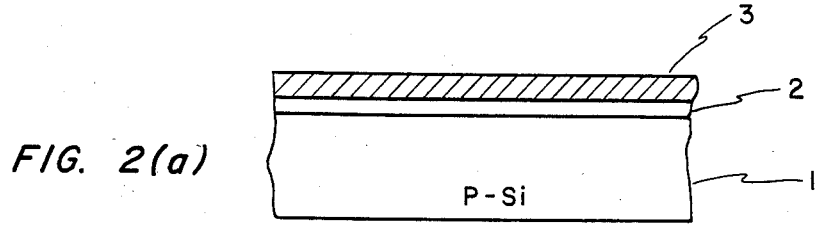
FIGS. 2(a) to 2(e) are cross sectional views of a semiconductor device according to an embodiment of this invention.
Figure 2B:
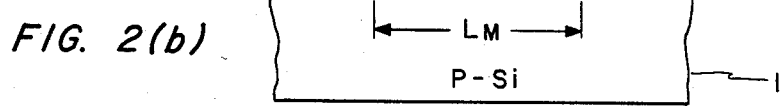
Figure 2C:
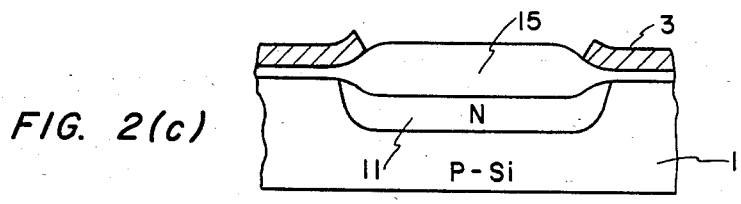
Figure 2D:
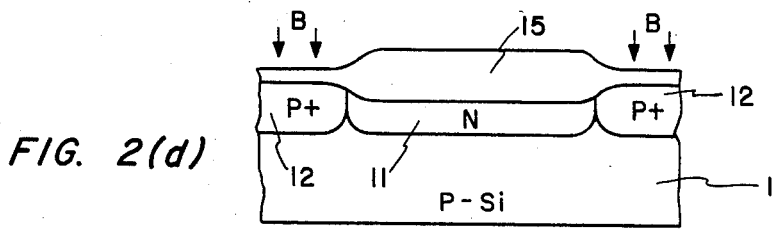
Figure 2E:
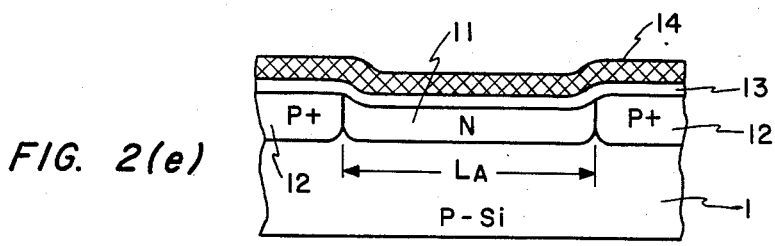

A feature of this embodiment is that the portion, at which the channel stopper is to be formed, is covered by the nitride layer 3. The nitride layer on the other portion, at which the active region is to be formed, is removed as shown in FIG. 2(b). Further, as shown in FIG. 2(c), when the thermal oxidization is achieved, not only is the bird's beak spread from the active region to the channel stopper, but also the channel of doped N-type silicon layer 11 is laterally spread. The impurity implanted for the channel stopper (for example, the boron) is not diffused into the portion which is covered by the relatively thick oxide layer 15 and by the bird's beak. As a result, the final active region is spread out to have the final width $L_A$ which greater than the originally defined width $L_M$, as shown in FIG. 2(e). This means that there is no reduction of the channel width, due to the bird's beak. The narrow channel effect is reduced even when the device is miniaturized.

Another feature is obtained when this invention is applied to the embedded channel CCD. This feature is based on the fact that the impurity of the N-type silicon layer which functions as the embedded channel layer is redistributed when the relatively thick thermal oxide layer 15 is formed as shown in FIG. 2(c). More specifically, when the oxidization is performed, the boundary between the silicon and the silicon dioxide is shifted to the inner portion of the silicon. The impurity in the N-type silicon layer, for example, the phosphorus or arsenic, accumulates near the boundary. This means that the practical thickness of the N-type silicon layer can be reduced to make a junction having a shallow thickness. The impurity can be distributed closer to the boundary. This makes it possible to increase the level of the signal which may be handled by the CCD.

What is claimed is:

1. A process for manufacturing a semiconductor device having an active region formed on a semiconductor substrate, the region being defined by a channel stopper, said method comprising the steps of:
   forming a first oxide layer by oxidizing a surface of said semiconductor substrate;
   forming a nitride layer over said first oxide layer;
   forming a second oxide layer having a predetermined thickness on a predetermined portion of said layer where said active region is to be formed, said second layer being formed by removing said nitride layer over said predetermined portion and then oxidizing;
   removing said nitride layer;
   implanting an impurity forming a channel stopper by using the second oxide layer as a mask;
   removing said second oxide layer;
   forming a gate oxide layer over said active region by oxidizing; and
   forming an electrode over said gate layer.

2. The process of claim 1 and the added step of making the second oxide layer with a thickness which precludes a lateral spreading the implanted impurity which forms said channel stopper.

3. The process step of claim 1 wherein said second oxide layer is formed by a thermal process, the thermal oxidation forming the oxide layers into a bird's beak spreading the active region where the impurities are implanted away from said channel.

4. The process of claim 1 wherein said second oxide layer is formed by a thermal process, said thermal process making the final active region wider than the area where the nitride layer is removed.

5. The process of claim 1 wherein said active region is one of many such regions on said substrate forming a charged couple device, and the thermal process redistributes channel layers in said charged couple device by accumulating impurities near boundary regions of said channels.

6. The process of claim 2 wherein said implanting step implants a channel stopper on opposing sides of said active region to define the width of said active region.

7. The process of claim 6 wherein said gate oxide layer covers both said active region and the stopper regions on the opposing sides of said active region.

8. The process step of claim 6 wherein a bird's beak region of said second oxide layer spreads over the channel stopper regions on opposing sides of the active region.

9. A process for making semiconductor devices comprising the steps of:
   (a) forming a substrate having a plurality of active regions for making a charged couple type of device;
   (b) covering a surface of said substrate with a first oxide layer responsive to an oxidization of the surface;
   (c) forming a nitride layer over said first layer;
   (d) removing said nitride layer at each of said active regions;
   (e) forming a deeper oxide layer in each active area by forming a second oxide layer in the areas where said nitride layer is removed, whereby the first oxide layer forms bird's beaks under the remaining nitride layer;
   (f) removing the rest of said nitride layer;
   (g) implanting impurities by using said second oxide layer as a mask, thereby forming channel stoppers between said active regions;
   (h) removing said second oxide layer;
   (i) forming a gate oxide layer over said active regions by oxidization; and
   (j) forming an electrode over at least one of said active regions.

10. The process of claim 9 wherein at least one of said steps includes a thermal procedure for redistributing channel material toward the boundaries of said active layers.

* * * * *